United States Patent [19]

Fournier

[11] Patent Number: 5,678,220
[45] Date of Patent: Oct. 14, 1997

[54] DEVICE FOR REJECTION OF THE IMAGE SIGNAL OF A SIGNAL CONVERTED TO AN INTERMEDIATE FREQUENCY

[75] Inventor: Jean Michel Fournier, Meylan, France

[73] Assignee: France Telecom, Paris, France

[21] Appl. No.: 449,616

[22] Filed: May 24, 1995

[30] Foreign Application Priority Data

Jun. 6, 1994 [FR] France .................................. 94 06894

[51] Int. Cl.$^6$ ...................................... H04B 1/10
[52] U.S. Cl. ................................ 455/302; 455/285
[58] Field of Search ......................... 455/285, 302, 455/303, 304, 296; 327/355, 362

[56] References Cited

U.S. PATENT DOCUMENTS

| | | | |
|---|---|---|---|
| 2,964,622 | 12/1960 | Fire | 455/302 |
| 3,575,660 | 4/1971 | Jorgensen | 325/388 |
| 4,243,955 | 1/1981 | Daniel et al. | 332/32 D |
| 4,531,236 | 7/1985 | Ishibara | 455/302 |
| 4,731,875 | 3/1988 | Mizukami et al. | 455/302 |

FOREIGN PATENT DOCUMENTS

| | | |
|---|---|---|
| A-0243733 | 11/1987 | European Pat. Off. |
| A-658558 | 11/1986 | Switzerland . |
| A-2236225 | 3/1991 | United Kingdom . |
| WO91/03882 | 3/1991 | WIPO . |

OTHER PUBLICATIONS

IEEE International Solid State Circuits Conference, vol. 36 Feb. 1993, New York pp. 144–145.

Microwave Journal, vol. 29, No. 10, Oct. 1986 Norwood US pp. 141–149.

*Primary Examiner*—Reinhard J. Eisenzopf
*Assistant Examiner*—Lee Nguyen
*Attorney, Agent, or Firm*—Robbins, Berliner & Carson, LLP

[57] ABSTRACT

In a device for rejecting the image signal of a signal converted to a predetermined intermediate frequency, a local oscillator supplies a local signal at a frequency chosen according to the frequency of the signal and the intermediate frequency. A first phase-shifter has two passive phase-shifter cells including resistive and capacitive components and respectively connected to the output of the oscillator to supply two mixer signals in phase quadrature. Two mixers receive an input signal containing a signal and its image signal and a respective mixer signal and supply two intermediate signals at the intermediate frequency. A second phase-shifter comprises two passive phase-shifter cells comprising resistive and capacitive components and respectively connected to the outputs of the two mixers to introduce a further phase quadrature relationship between the two intermediate signals. A summing device connected to the outputs of the two passive phase-shifter cells of the second phase-shifter eliminates the image signal.

5 Claims, 2 Drawing Sheets

DEVICE FOR REJECTION OF THE IMAGE SIGNAL OF A SIGNAL CONVERTED TO AN INTERMEDIATE FREQUENCY

BACKGROUND OF THE INVENTION

1. Field of the Invention

The invention concerns rejection of the image signal of a signal converted to an intermediate frequency.

The invention is advantageously, but not exclusively, applied in integrated radio receiver systems operating at frequencies of around 1 GHz to around 3 GHz using bipolar silicon or BiCMOS technology, i.e. based on semiconductor components such as bipolar transistors and/or complementary field effect transistors, together with passive resistive or capacitive components.

2. Description of the Prior Art

In narrowband channel radio and microwave receiver systems, selectivity requires conversion of the selected channel to a predetermined fixed intermediate frequency. This uses a local signal the frequency of which is chosen according to the frequency of the selected channel and the intermediate frequency. To be more precise, the local signal frequency is made such that the modulus of the difference between the received signal frequency and the local signal frequency is equal to the intermediate frequency.

The person skilled in the art is Well aware that for each received signal there exists an "image" signal having a frequency which satisfies the above relationship and which is superimposed on the received signal.

One solution to the problem of rejecting the image signal of the received signal, both converted to the same predetermined intermediate frequency, is to use integrated electronic signal processing devices.

The solution most widely used, and described for example in the article by Mark D. McDonald "A 2.5 GHz BiCMOS Image-Reject Front End" ISSCC 93/SESSION 9/RADIO COMMUNICATION CIRCUITS/PAPER TP 9.4, 1993, is to use a local oscillator driving two multipliers in phase quadrature via a first phase-shifter to convert the received input signal into two signals at said intermediate frequency on two parallel channels. A second phase-shifter introducing a further phase-shift of 90° is included in one of the channels. Thereafter the resultant wanted signals on the two channels derived from the received signal are in phase whereas the resultant signals on the two channels derived from the image signal are 180° out of phase. If the amplitudes of the signals on the two channels are exactly the same, a summing device can eliminate the "image" of the signal.

The phase-shifters are usually arrays of passive resistive and capacitive components, which can easily be integrated and which are well-suited to the range of frequencies employed.

These phase-shifters are critical since image signal rejection is highly sensitive to the phase-shift and to the amplitude difference between the two signals at the inputs of the summing device produced by the phase-shifters. To be more precise, in these devices, the difference between the amplitudes of the two signals that are summed depends on the resistive and capacitive components, the values of which can vary by amounts in the order of 10% to 20%, and on variations in the local oscillator frequency.

Although the second phase-shifter does not attenuate the signal passing through it, it leads to an inaccuracy in the phase-shift because of the inaccuracies in the resistance and capacitance values, which affect centering of these components relative to the intermediate frequency.

In conclusion, the phase-shift and amplitude inaccuracies resulting from the presence of the two phase-shifters in these devices lead to imperfect rejection of the image signal.

The invention is directed to making image signal rejection less sensitive to variations in the components used, especially bipolar silicon or BiCMOS integrated components.

SUMMARY OF THE INVENTION

The invention consists in a device for rejecting the image signal of a signal converted to a predetermined intermediate frequency, comprising:

a local oscillator supplying a local signal at a frequency chosen according to the frequency of the signal and the intermediate frequency, a first phase-shifter having two passive phase-shifter cells including resistive and capacitive components and respectively connected to the output of said oscillator to supply two mixer signals in phase quadrature, two mixers each receiving an input signal containing said signal and said image signal and a respective one of said two mixer signals and supplying two intermediate signals at said intermediate frequency, a second phase-shifter comprising two passive phase-shifter cells comprising resistive and capacitive components and respectively connected to the outputs of said two mixers to introduce a further phase quadrature relationship between said two intermediate signals, and image signal eliminator means comprising a summing device connected to the outputs of said two passive phase-shifter cells of said second phase-shifter.

The resultant phase quadrature relationship between the two mixing signals at the output of each phase-shifter cell of the first phase-shifter is then independent of the local oscillator frequency. Further, the additional phase quadrature relationship between the two processor channels introduced by the second phase-shifter is also independent of the intermediate frequency. In other words, by dividing the phase-shifters between the channels, the invention makes the phase-shifts introduced by the phase-shifters independent of the local and intermediate frequencies and therefore independent of inaccuracies in the values of the phase-shifter resistive and capacitive components. This achieves a first improvement in terms of reducing the sensitivity of image signal rejection to variations in the parameters of the components used.

It is advantageous if one of the two passive cells of the two phase-shifters connected to one of the mixers includes a resistive-capacitive cell and the other includes a capacitive-resistive cell, while one of the two passive cells of the two phase-shifters connected to the other mixer includes a capacitive-resistive cell and the other includes a resistive-capacitive cell. Also, one input of the summing device is inverted.

In other words, a resistive-capacitive phase-shifter cell is followed by a capacitive-resistive phase-shifter cell on each channel, and vice versa. This distribution of the phase-shifter cells provides first order compensation of attenuation differences due to the phase-shifters. This embodiment of the invention makes the attenuation introduced by the phase-shifters less sensitive to centering of the passive components relative to the local and intermediate frequencies initially chosen. Thus the invention obtains a second improvement in terms of reducing the sensitivity of image signal rejection to component variations.

It is also advantageous for the rejection means to include a voltage-controlled gain amplifier connected between one input of the summing device and the output of the corresponding passive phase-shifter cell of the second phase-shifter, the gain of this amplifier being controlled by the local oscillator control voltage.

The addition of voltage-controlled gain between the two inputs of the summing device compensates variation in the amplitude of the mixer signals due to variation in the local oscillator frequency. This variation can be compensated by using the control voltage of the voltage-controlled local oscillator to control the differential gain of the summing device. Further, the superimposition of a constant voltage on the gain control voltage compensates for the difference between the two intermediate signals due to inaccurate centering of this frequency relative to the second phase-shifter. This enables a posteriori choice of an optimum intermediate frequency for the device which is different from that for which the second phase-shifter was initially centered, without compromising image frequency rejection. The same principle can be used to compensate for any gain difference between the two mixers.

Other advantages and features of the invention will emerge from a reading of the following detailed description of one non-limiting embodiment of the invention and from the appended drawings.

DETAILED DESCRIPTION OF THE PREFERRED EMBODIMENT

Figure 1:
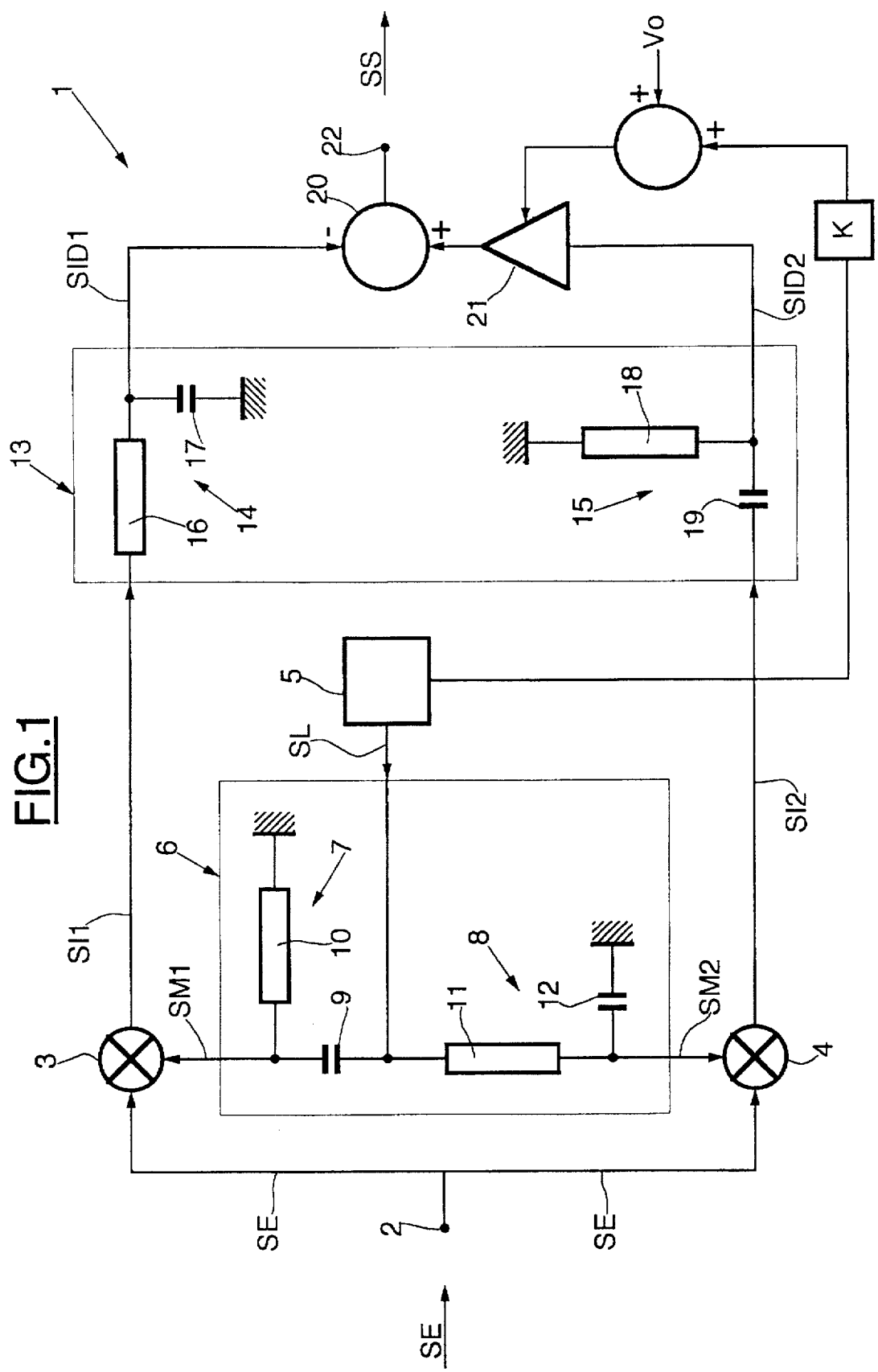
FIG. 1 is a diagram showing one embodiment of the device of the invention.

Referring to FIG. 1, the device 1 of the invention is implemented in BiCMOS silicon technology, for example, and includes a signal input 2 which receives an input signal SE containing a signal and its image signal. As the person skilled in the art knows, the frequency of the image signal is equal to FB+2FI where FB is the frequency of the signal and FI is the intermediate frequency of the intermediate signal to which the input signal SE is converted.

Two mixers 3 and 4, in the form of multipliers, for example, are connected to the signal input 2. They also receive at their input two mixer signals SM1 and SM2 obtained from a local signal SL supplied by a voltage-controlled local oscillator 5. The frequency FL of the local signal is adjusted so that FI=|FB−FL|.

In more detail, the output of the local oscillator 5 is connected to the input of a first phase-shifter 6 including two passive phase-shifter cells 7 and 8.

The phase-shifter cell 7 is a capacitive-resistive cell in the sense that it includes a capacitor 9 connected in series between the output of the oscillator 5 and the input of the corresponding multiplier 3 and a resistor 10 connected between ground and the side of the capacitor 9 connected to the input of the mixer 3.

The phase-shifter cell 8 is a resistive-capacitive cell in the sense that it includes a resistor 11 connected in series between the output of the oscillator 5 and the input of the other mixer 4 and a capacitor 12 connected between ground and the side of the resistor 11 connected to the input of the mixer 4.

The outputs of the two mixers 3 and 4 are connected to the two inputs of the summing device 20 (one of which is an inverting input) via a second phase-shifter 13 also comprising two passive phase-shifter cells with resistive and capacitive components divided between the two processor channels.

In more detail, the passive phase-shifter cell 14 is a resistive-capacitive cell in the sense that it includes a resistor 16 connected in series between the output of the corresponding mixer 3 and the summing device 20 and a capacitor 17 connected between ground and the side of the resistor 16 connected to the summing device.

On the other hand, the passive phase-shifter cell 15 on the other channel is a capacitive-resistive cell in the sense that here it is the capacitor 19 which is connected in series between the output of the mixer and the summing device and the resistor 18 which is connected between ground and the side of the capacitor connected to the summing device.

Passive phase-shifter cells using only resistors and capacitors are suitable for radio frequency applications up to a few gigahertz. For higher frequencies, however, and especially for microwave frequencies, a more refined modelling of the components is required (to introduced inductance and propagation phenomena). Nevertheless, the operating principle described in more detail below remains the same despite the addition of these other passive components.

In the embodiment of the invention shown in FIG. 1, one input of the summing device is an inverting input. In the example shown this is the input connected to the output of the phase-shifter cell 14. Of course, it could have been the other input. Also, the inverting input is represented schematically in FIG. 1 by the symbol −. It can be obtained by inserting an inverter between the output of the phase-shifter cell 14 and an adder forming the summing device. Alternatively, a subtractor could be used instead of the summing device.

The output of the summing device 20 is connected to the signal output 22 of the device supplying an output signal SS from which the image signal has been eliminated, or virtually so.

The embodiment shown here entails the incorporation of a voltage-control gain amplifier 21 in one channel, in this instance the channel including the mixer 4. The amplifier 21 is connected between the output of the corresponding passive phase-shifter cell and the corresponding input of the summing device. Its gain control input receives the control voltage of the local oscillator 5 multiplied by a fixed gain K.

Figure 2:
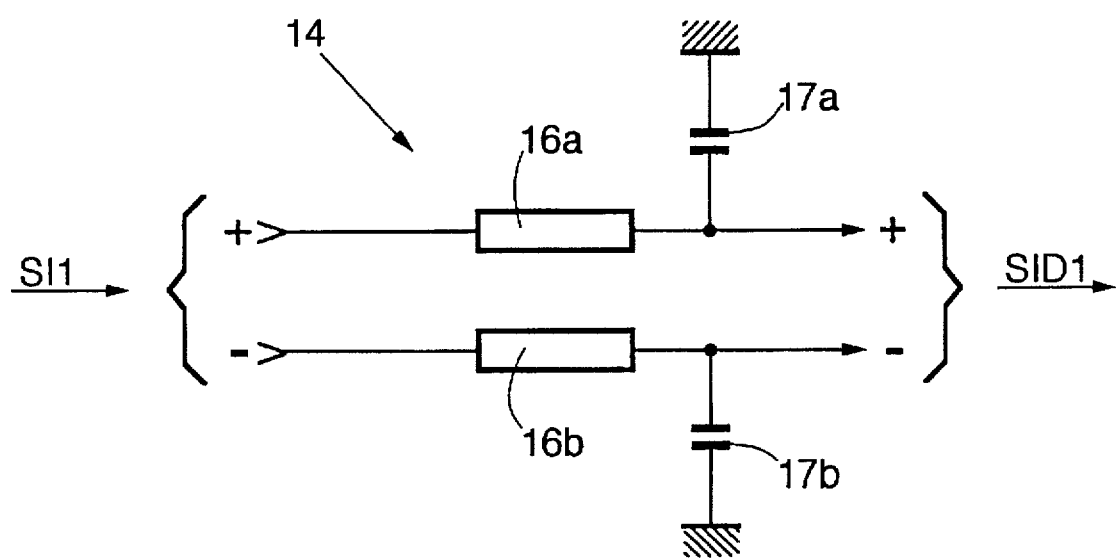
FIG. 2 shows in more detail a phase-shifter cell of the device from FIG. 1 which can be used on processor channels conveying differential signals.

The embodiment of the invention shown in FIG. 1 is represented in a highly schematic manner. It will be obvious to the person skilled in the art how to implement the invention on the basis of this illustration. For example, if the processor channels usually convey differential signals, the inputs of the mixers, the summing device and the variable gain amplifier will in fact be differential input pairs. In this case the inversion at one of the inputs of the summing device (FIG. 1) is achieved simply by interchanging the two lines forming the differential pair at the corresponding input. Moreover, as shown in FIG. 2, a resistive-capacitive cell such as the cell 14 will in fact comprise two resistors 16a and 16b respectively connected in series into the + and − lines and two capacitors 17a and 17b respectively connected between ground and each of the + and − lines.

The operation of the device of the invention will now be described.

The phase-shifter cell 7 of the first phase-shifter 6 shifts the phase of the mixer signal SM1 by $\pi/2 - \phi1$ relative to the local signal SL. The phase-shifter cell 8 shifts the phase of the mixer signal SM2 by $-\phi1$ relative to the local signal SL.

The person skilled in the art is well aware that $\phi 1 =$ Arctan $(R.C.2.\pi.FL)$ where Arctan denotes the Arctangent function, FL the local signal frequency, R the value of the resistors 10 and 11 and C the value of the capacitors 9 and 12. The phase-shift between the two mixer signals SM1 and SM2 is therefore equal to $\pi/2$ and is independent of the value of the frequency FL of the local signal SL and of the value of the resistors and capacitors of the phase-shifter cells.

On the other hand, the ratio of the moduli |SM1|/|SM2| of the signals SM1 and SM2, representative of the amplitude difference between the two signals SM1 and SM2 or of the attenuation introduced by the phase-shifter 6, is equal to the product $R.C.2.\pi.FL$ and is therefore dependent on the value of the local frequency FL and on the values of the components. Moreover, the signals entering the second phase-shifter 13 with a given phase-shift between them leave the phase-shifter 13 with an additional mutual phase difference of $\pi/2$. The second phase-shifter 13 thus introduces an additional phase quadrature relationship between the two processor channels. However, as with the first phase-shifter 6 this additional phase-shift is independent of the signal frequency (the intermediate frequency in this instance) and of the resistor and capacitor values.

Thus the inclusion in each phase-shifter 6 and 13 of a phase-shifter cell on each channel makes the phase-shift finally obtained at the output of the second phase-shifter independent of the centering of the various components relative to the respective frequencies or, in other words, inaccuracies in the values of the resistors and capacitors employed.

This advantage is obtained as soon as the structure of each phase-shifter is divided between the processor channels, independently of the fact that on each processor channel there is either a resistive-capacitive cell followed by a capacitive-resistive cell, or vice versa, or two cells of the same type.

However, since each phase-shifter attenuates signals by an amount which depends on the values of the respective frequencies and the values of the resistors and capacitors used, it is preferable to have on each processor channel a capacitive-resistive cell (for example the cell 6) followed by a resistive-capacitive cell (for example the cell 14), and vice versa (cells 8 and 15). This combination procures an attenuation |SID1|/|SID2| of the signals SID1 and SID2 at the input of the summing device equal to the ratio (R.C.FL)/(R'.C'.FI) where R and C denote the resistor and capacitor values of the first phase-shifter and R' and C' denote the resistor and capacitor values of the second phase-shifter. The theoretical resistor and capacitor values R, C, R' and C' are naturally chosen, allowing for the values chosen for FL and FI, to obtain a ratio equal to 1, i.e. no attenuation.

This attenuation is virtually independent (to a first approximation) of the inaccuracies in the resistor and capacitor values since, firstly:

$$\frac{\Delta SID1}{SID1} - \frac{\Delta SID2}{SID2} = \frac{\Delta R}{R} - \frac{\Delta R'}{R'} + \frac{\Delta C}{C} - \frac{\Delta C'}{C'}$$

and, secondly, the relative variations in resistance values are substantially the same and likewise the relative variations in capacitance values.

In conjunction with this particular arrangement of the phase-shifter cells, one input of the summing device 20 must be an inverting input. The intermediate signal SI1 at the intermediate frequency FI at the output of the mixer 3 in fact comprises the converted signal having a phase equal to $-\pi/2+\phi 1$ and the converted image signal having a phase equal to $-\phi 1$.

The intermediate signal SI2 also comprises the converted signal having a phase equal to $\phi 1$ and the converted image signal having a phase equal to $-\phi 1$.

The signal SID1 at the output of the second phase-shifter 13 comprises a wanted signal having a phase equal to $-\pi/2+\phi 1-\phi 2$ and an image signal having a phase equal to $\pi/2-\phi 1-\phi 2$ and the signal SID2 comprises the wanted signal having a phase equal to $\phi 1+\pi/2+\phi 2$ and the image signal having a phase equal to $-\phi 1+\pi/2-\phi 2$.

Note that the two image signals at the output of the second phase-shifter are in phase whereas the two wanted signals are in phase opposition, so that one input of the summing device must be an inverting input.

Of course, it would not be necessary to invert one input of the summing device if the second phase-shifter 13 were to have a similar structure to the first phase-shifter 6, i.e. if the phase-shifter cell 14 were also a capacitive-resistive cell like the cell 7 (in which case the phase-shifter cell 15 would be a resistive-capacitive cell like the cell 8).

Although the specific arrangement of the two phase-shifters just described provides a satisfactory solution to the problem of component value variations, the difference between the amplitudes of the two signals SID1 and SID2 is still dependent on the frequency FL of the local oscillator.

To compensate any such variation in amplitude the differential gain between the two inputs of the summing device 20 is varied by using the control voltage of the local oscillator 5 (multiplied by a predetermined gain K) to control the gain of the amplifier 21. The range of variation in the gain of the amplifier 21 can therefore be matched to the range of variation in the frequency of the local signal.

Also, adding a voltage Vo to the voltage controlling the gain of the amplifier 21:

compensates for the difference between the amplitudes of the signals SID1 and SID2 due to a posteriori adjustment of the intermediate frequency independently of the second phase-shifter network 13, which is adjusted for an initially chosen intermediate frequency, and compensates for any difference between the gains of the mixers 3 and 4.

There is claimed:

1. Device for rejecting the image signal of a signal converted to a predetermined intermediate frequency, comprising:

a local oscillator supplying a local signal at a frequency chosen according to the frequency of the signal and the intermediate frequency, a first phase-shifter having two passive phase-shifter cells including resistive and capacitive components and respectively connected to the output of said oscillator to supply two mixer signals in phase quadrature, two mixers each receiving an input signal containing said signal and said image signal and a respective one of said two mixer signals and supplying two intermediate signals at said intermediate frequency, a second phase-shifter comprising two passive phase-shifter cells comprising resistive and capacitive components and respectively connected to the outputs of said two mixers to introduce a further phase quadrature relationship between said two intermediate signals, and image signal eliminator means comprising a summing device connected to the outputs of said two passive phase-shifter cells of said second phase shifter, wherein one of said two passive phase-shifter cells of said two phase-shifters is connected to one of said mixers and includes a resistive-capacitive cell and the other cell connected to said mixer includes a capacitive-resistive cell such that said resistive-capacitive cell is followed by a capacitive-resistive cell, and one of said two passive phase-shifter cells of said two phase-shifters is connected to the other mixer and includes a capacitive-resistive cell and the other cell connected to said mixer includes a resistive-capacitive cell such that said capacitive-resistive cell is followed by a resistive-capacitive cell, and one input of said summing device is an inverting input and said device is realized in an integrated technology.

2. Device according to claim 1 wherein said eliminator means include a voltage-controlled gain amplifier connected between one input of said summing device and the output of the corresponding passive phase-shifter cell of said second phase-shifter and said gain is controlled by the control voltage of said local oscillator.

3. Device according to claim 2 wherein the gain of said amplifier is controlled by the control voltage of the local oscillator and a selected external voltage.

4. Device for rejecting the image signal of a signal converted to a predetermined intermediate frequency, comprising:

a local oscillator supplying a local signal at a frequency chosen according to the frequency of the signal and the intermediate frequency, a first phase-shifter having two passive phase-shifter cells including resistive and capacitive components and respectively connected to the output of said oscillator to supply two mixer signals in phase quadrature, two mixers each receiving an input signal containing said signal and said image signal and a respective one of said two mixer signals and supplying two intermediate signals at said intermediate frequency a second phase-shifter comprising two passive phase-shifter cells comprising resistive and capacitive components and respectively connected to the outputs of said two mixers to introduce a further phase quadrature relationship between said two intermediate signals, and image signal eliminator means comprising a summing device connected to the outputs of said two passive phase-shifter cells of said second phase-shifter, wherein said eliminator means include a voltage-controlled gain amplifier connected between one input of said summing device and the output of the corresponding passive phase-shifter cell of said second phase-shifter and said gain is controlled by the control voltage of said local oscillator.

5. Device according to claim 4 wherein the gain of said amplifier is controlled by the control voltage of the local oscillator and a selected external voltage.

* * * * *